United States Patent [19]
Ariie

[11] Patent Number: 5,680,078
[45] Date of Patent: Oct. 21, 1997

[54] MIXER

[75] Inventor: Mitsuo Ariie, Nagaokakyo, Japan

[73] Assignee: Murata Manufacturing Co., Ltd., Japan

[21] Appl. No.: 677,075

[22] Filed: Jul. 9, 1996

[30] Foreign Application Priority Data

Jul. 10, 1995 [JP] Japan ................................ 7-173727
Jul. 24, 1995 [JP] Japan ................................ 7-187292

[51] Int. Cl.$^6$ .................................................. H03C 1/36
[52] U.S. Cl. ................... 332/178; 332/106; 375/300; 455/108
[58] Field of Search ........................ 332/106, 168, 332/177, 178; 327/306; 375/300, 301; 455/108, 109

[56] References Cited

U.S. PATENT DOCUMENTS 3,673,515  6/1972  Kersten ................................ 332/178
3,924,203  12/1975  Schemmel ............................ 332/106

*Primary Examiner*—David Mis
*Attorney, Agent, or Firm*—Ostrolenk, Faber, Gerb & Soffen, LLP

[57] ABSTRACT

A voltage and a data signal superimposed on the voltage are input to the drain of an FET and a carrier signal is input to the gate of the FET. The FET mixes the data signal and the carrier signal to generate the mixed signal. Two capacitors are connected between the source and ground for blocking direct current and passing alternating current.

8 Claims, 2 Drawing Sheets

5,680,078

1

MIXER

BACKGROUND OF THE INVENTION

1. Field of the Invention

The present invention relates to mixers used for modulators such as orthogonal modulators, demodulators, detectors, multipliers, frequency converters, or the like, and more particularly, to a mixer for combining a carrier signal and a data signal.

2. Description of the Related Art

FIG. 3 is a view showing a configuration of a modulator which includes a conventional mixer. In FIG. 3, the modulator includes signal input terminals I100 and I200, a signal output terminal O100, a bias power supply $V_G$, and a mixer 100.

The mixer 100 has an FET Q100, a capacitor C100, and a coil L100. The source S of the FET Q100 is grounded. The capacitor C100 is disposed between the drain D of the FET Q100 and the signal output terminal O100. The capacitor C100 has a capacitance (for example, 10 pF) which acts as a low impedance at the frequency of a mixed signal $S_O$ and as a high impedance at the frequency $f_s$ of a data signal $S_s$. The coil L100 is disposed between the drain D of the FET Q100 and the signal input terminal I100. The coil L100 has an inductance (for example, 10 nH) which shows a high impedance at the frequency of the mixed signal $S_O$ and shows a low impedance at the frequency of the data signal $S_s$.

The data signal $S_s$ (for example, a sine-wave signal having a frequency $f_s$ of 50 kHz) is input to the signal input terminal I100. A DC voltage $V_{cc}$ is also supplied to the signal input terminal I100. With this configuration, the data signal $S_s$ is input and the DC voltage $V_{cc}$ is supplied to the source S of the FET Q100 in the mixer 100 through the coil L100.

To the signal input terminal I200, a carrier signal $S_c$ (for example, a sine-wave signal having a frequency $f_c$ of 1.5 GHz) is input. This carrier signal $S_c$ is input to the gate G of the FET Q100 through a capacitor C600. The gate G of the FET Q100 is negatively biased by the bias power supply $V_G$ through a bias resistor $R_{g1}$.

An operation of this circuit will be described next. When the DC voltage $V_{cc}$ is supplied, a DC current flows between the drain D and the source S of the FET Q100. The data signal S, is sent from the signal input terminal I100 to the drain D of the FET Q100 through the coil L100 of the mixer 100. The carrier signal $S_c$ is given to the gate G of the FET Q100 from the signal input terminal I200 through the DC-blocking capacitor C600. The FET Q100 combines the carrier signal $S_c$ and the data signal $S_s$, and outputs the mixed signal $S_O$ including sideband components having frequencies of $f_c \pm f_s$.

The capacitor C100 blocks the data signal $S_s$ and passes the mixed signal $S_O$. Therefore, only the mixed signal $S_O$, which is made by amplitude-modulating the carrier signal $S_c$ with the data signal $S_s$, is output from the signal output terminal O100.

FIG. 4 is a view showing a configuration of a modulator including another conventional mixer. Sections corresponding to those in the modulator shown in FIG. 3 are assigned the same numbers, and the descriptions thereof will be omitted here.

Since, in the mixer 100, shown in FIG. 3, the gate G of the FET Q100 needs to be biased, the negative bias power supply $V_G$ is required in addition to the positive power supply. In a mixer 200 as shown in FIG. 4, the FET Q100 is biased by itself, solving a drawback in the mixer 100 shown in FIG. 3.

As portable telephones have been wide-spread in recent years, a compact, low-power-consumption mixer which can operate at a low voltage with a single positive power supply is demanded.

The mixers shown in FIGS. 3 and 4, however, cannot operate with low power consumption due to a direct current flowing between the drain D and the source S of the FET Q100.

Since a certain voltage (2 V or more, for example) is required between the drain D and the source S of the FET Q100 in order to cause a direct current to flow through the FET, and a voltage drop takes place at a bias resistor $R_{g2}$, the FETs cannot operate at a low voltage.

SUMMARY OF THE INVENTION

Accordingly, it is an object of the present invention to provide a low-power-consumption or zero-power-consumption mixer which operates at a low voltage and can be easily integrated to make it compact.

The foregoing object is achieved in one aspect of the present invention through the provision of a mixer for mixing a carrier signal and a data signal, comprising: an FET for mixing the carrier signal and the data signal to generate a mixed signal by inputting a certain voltage and the data signal which is superimposed on the certain voltage to the drain of the FET and by inputting the carrier signal to the gate of the FET; and at least one capacitive device for separating the source of the FET from ground with respect to direct currents and for grounding the source with respect to alternating currents.

Since the certain voltage is input to the drain of the FET and the first capacitive device separates the source of the FET from the ground with respect to direct currents and grounds the source with respect to alternating currents, the certain voltage can be as low as that which assures that the drain and the source have higher voltages than the gate, and no direct current flows into the FET. Therefore, the power consumption of the FET is substantially zero, enabling a low-voltage operation.

The mixer may further comprise a second capacitive device which is connected to the drain of the FET and which shows a low impedance at the frequency of the mixed signal and a high impedance at the frequency of the data signal.

Since the second capacitive device shows a low impedance at the frequency of the mixed signal and a high impedance at the frequency of the data signal, the capacitance of the second capacitive device can be low for a mixed signal having a submicrowave frequency or more. Therefore, the mixer can be easily integrated.

The mixer may further comprise an inductive device which is connected to the drain of the FET and which shows a high impedance at the frequency of the mixed signal and a low impedance at the frequency of the data signal.

Since the inductive device shows a high impedance at the frequencies ($f_c \pm f_s$) of the mixed signal and a low impedance at the frequency of the data signal, the inductance of the inductive device can be low for a mixed signal having a sub-microwave frequency or more. Therefore, the mixer can be easily integrated, and the mixed signal is prevented from flowing into the other side of the inductive device.

The foregoing object is achieved in another aspect of the present invention through the provision of a mixer for mixing a carrier signal and a data signal, comprising: a FET for mixing the carrier signal and the data signal to generate a mixed signal by inputting a certain voltage and the data signal which is superimposed on the certain voltage to the source of the FET and by inputting the carrier signal to the gate of the FET; and at least one capacitive device for separating the drain of the FET from the ground with respect to direct currents and for grounding the drain with respect to alternating currents.

Since the certain voltage is input to the source of the FET and the first capacitive device separates the drain of the FET from the ground with respect to direct currents and grounds the drain with respect to alternating currents, the certain voltage can be as low as that needed to assure that the drain and the source have higher voltages than the gate has, and no direct current flows into the FET. Therefore, the power consumption of the FET is substantially zero, enabling a low-voltage operation.

The mixer may further comprise a second capacitive device which is connected to the source of the FET and which shows a low impedance at the frequency of the mixed signal and a high impedance at the frequency of the data signal.

Since the second capacitive device shows a low impedance at the frequency of the mixed signal and a high impedance at the frequency of the data signal, the capacitance of the second capacitive device can be low for a mixed signal having a submicrowave frequency or more. Therefore, the mixer can be easily integrated.

The mixer may further comprise an inductive device which is connected to the source of the FET and which shows a high impedance at the frequency of the mixed signal and a low impedance at the frequency of the data signal.

Since the inductive device shows a high impedance at the frequencies ($f_c \pm f_s$) of the mixed signal and a low impedance at the frequency of the data signal, the inductance of the inductive device can be low for a mixed signal having a sub-microwave frequency or more. Therefore, the mixer can be easily integrated, and the mixed signal is prevented from flowing into the other side of the inductive device.

DETAILED DESCRIPTION OF THE PREFERRED EMBODIMENT

Figure 1:
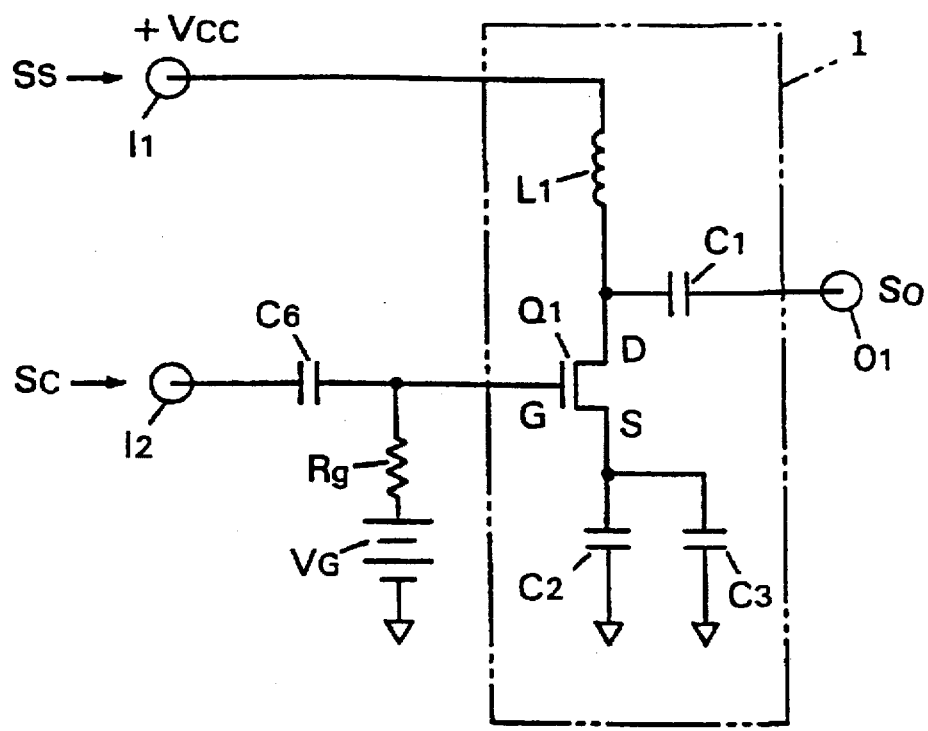
FIG. 1 is a circuit diagram showing a configuration of a modulator including a mixer according to an embodiment of the present invention.

An embodiment of the present invention will be described below by referring to the drawings. FIG. 1 is a circuit diagram showing a configuration of a modulator including a mixer according to an embodiment of the present invention. In FIG. 1, the modulator includes signal input terminals I1 and I2, a signal output terminal O1, a bias power supply $V_g$, and a mixer 1.

The mixer 1 has an FET Q1, three capacitors C1, C2, and C3, and a coil L1. Capacitors C2 and C3 are disposed between the source S of the FET Q1 and ground. They have the total capacitance (for example, 10 pF) which floats the source S of the FET Q1 from ground with respect to direct currents and connects the source to the ground with respect to alternating currents. Capacitor C1 is disposed between the drain D of the FET Q1 and the signal output terminal O1. Capacitor C1 has a capacitance (for example, 10 pF) which acts as a low impedance at the frequency of a mixed signal $S_O$ and as a high impedance at the frequency $f_s$ of a data signal $S_s$. The coil L1 is disposed between the drain D of the FET Q1 and the signal input terminal I1. The coil L1 has an inductance (for example, 10 nH) which shows a high impedance at the frequency of the mixed signal $S_O$ and shows a low impedance at the frequency of the data signal $S_s$. The mixer is integrated into a chip on one substrate, excluding capacitors C2 and C3.

The data signal $S_s$ (for example, a sine-wave signal having a frequency $f_s$ of 50 kHz) is input to the signal input terminal I1. A DC voltage $V_{cc}$ is also supplied to the signal input terminal I1. With this configuration, the data signal $S_s$ is input as well as the DC voltage $V_{cc}$ is supplied to the source S of the FET Q1 in the mixer 1 through the coil L1.

To the signal input terminal I2, a carrier signal $S_c$ (for example, a sine-wave signal having a frequency $f_c$ of 1.5 GHz) is input. This carrier signal $S_c$ is input to the gate G of the FET Q1 through a capacitor C6. The gate G of the FET Q1 is positively biased by the bias power supply $V_G$ through a bias resistor $R_g$. To operate the FET Q1 of the mixer 1, it is possible to supply a low, DC voltage $V_{cc}$ (for example, 1.5 V or less) which assures that the drain D and the source S are positive in voltage against the gate G in the FET Q1. Therefore, it is sufficient for the DC-voltage power supply $V_{cc}$ to supply a power of 1.5 V in order to operate the mixer 1.

An operation of this circuit will be described next. When the DC voltage $V_{cc}$ is supplied, since the source S of the FET Q1 is open with respect to direct currents due to capacitors C2 and C3 in the mixer 1, the drain D of the FET Q1 has the same voltage as the source S. In addition, the FET Q1 is open with respect to direct currents due to capacitors C2 and C3, and a direct current does not flow through the FET. Therefore, the power consumption of the FET Q1 is zero. Since a current does not flow, it is not required to have a voltage between the drain and the source. A voltage drop does not take place, enabling the FET to operate at a low voltage.

The data signal $S_s$ is sent from the signal input terminal I1 to the drain D of the FET Q1 through the coil L1 of the mixer 1. The carrier signal $S_c$ is given to the gate G of the FET Q1 from the signal input terminal I2 through the DC-blocking capacitor C6. The FET Q1 combines the carrier signal $S_c$ and the data signal $S_s$, and outputs the mixed signal $S_O$ including sideband components having frequencies of $f_c \pm f_s$.

Capacitor C1 blocks the data signal S, and passes the mixed signal $S_O$. Therefore, only the mixed signal $S_O$, which is made by amplitude-modulating the carrier signal $S_c$ with the data signal $S_s$, is output from the signal output terminal O1. Since the mixed signal $S_O$ includes components having frequencies of $nf_c \pm mf_s$ (where n and m are positive integers), the signal having the desired frequency (the component having a frequency of $f_c + f_s$, or that of $f_c - f_s$, in a usual case) is selected and used among these frequency components with the use of a filter.

Capacitor C1 has a capacitance which acts as a low impedance at the frequency of the mixed signal $S_O$ and as a high impedance at the frequency $f_s$ of the data signal $S_s$.

Therefore, the data signal $S_s$ does not flow to capacitor C1 and is positively input to the drain D of the FET Q1. The coil L1 has an inductance which shows a high impedance at the frequency of the mixed signal $S_O$ and shows a low impedance at the frequency of the data signal $S_s$. Therefore, the mixed signal $S_O$ does not flow into the coil L1. When a mixed signal has a sub-microwave frequency or more, the capacitance of the capacitor C1 and the inductance of the inductor L1 can be small. The mixer is easily integrated.

With this mixer, it is also possible to input a local signal to the gate G of the FET Q1 and an RF signal to the drain D of the FET Q1 through the capacitor C1. It is thus possible to obtain an IF signal, which has a difference component between the RF frequency and the carrier frequency, from the drain D through the coil L1. Capacitor C1 shows a low impedance for the RF signal and a high impedance for the IF signal. The coil L1 shows a high impedance for the RF signal and a low impedance for the IF signal. The IF signal frequency is lower than the local-signal frequency and the RF-signal frequency. As described above, the mixer can serve as a downconverter.

In the above embodiment, the mixer is used as an amplitude modulator. The present invention can also be applied to other modulators, demodulators, detectors, multipliers, frequency converters, image-reject mixers, and the like.

In the embodiment, two capacitors C2 and C3 are disposed between the ground and the source S of the FET Q1. Only one capacitor may be used instead.

Figure 2:
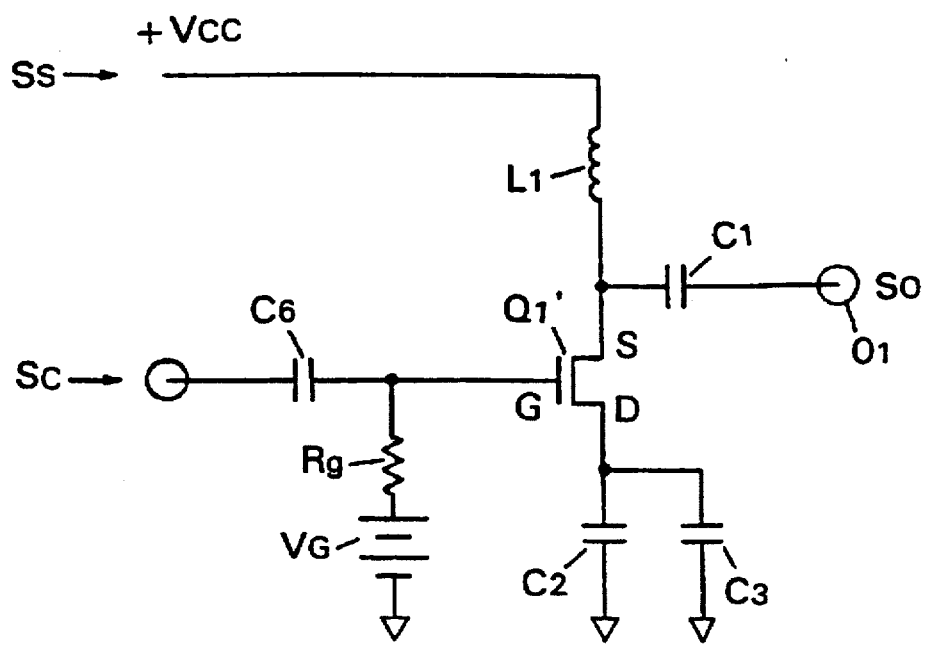
FIG. 2 is a circuit diagram showing a configuration of a modulator including a mixer according to a second embodiment of the present invention.
Figure 3:
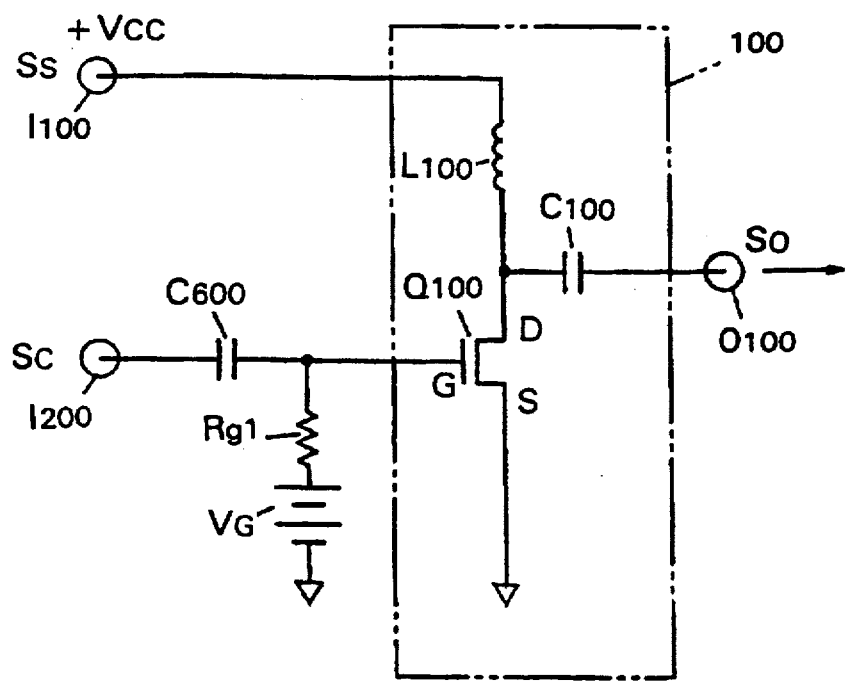
FIG. 3 is a view showing a configuration of a modulator including a conventional mixer.
Figure 4:
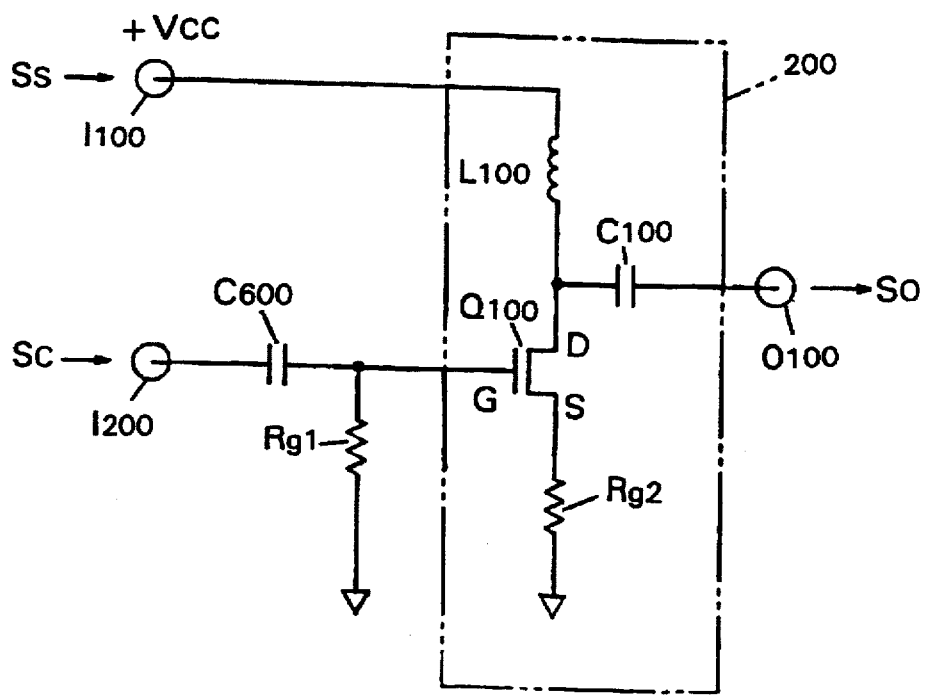
FIG. 4 is a view showing a configuration of a modulator including another conventional mixer.

The drain and the source of the FET Q1 can be switched according to a second embodiment of the invention as shown in FIG. 2.

While a particular embodiment of the present invention has been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A mixer for mixing a carrier signal and a data signal, comprising:

an FET for mixing said carrier signal and said data signal which is capable of generating a mixed signal by receiving a voltage and said data signal which is superimposed on said voltage via the drain of said FET and by receiving said carrier signal via the gate of said FET; and at least one capacitive device connected between the source of said FET and ground for blocking direct current and for passing alternating current.

2. A mixer according to claim 1, further comprising a second capacitive device which is connected to the drain of said FET and which has a low impedance at the frequency of said mixed signal and a high impedance at the frequency of said data signal.

3. A mixer according to claim 1, further comprising:

an inductive device which is connected to the drain of said FET and which has a high impedance at the frequency of said mixed signal and a low impedance at the frequency of said data signal.

4. A mixer according to claim 2, further comprising:

an inductive device which is connected to the drain of said FET and which has a high impedance at t. he frequency of said mixed signal and a low impedance at the frequency of said data signal.

5. A mixer for mixing a carrier signal and a data signal, comprising:

a FET for mixing said carrier signal and said data signal which is capable of generating a mixed signal by receiving a voltage and said data signal which is superimposed on said voltage via the source of said FET and by receiving said carrier signal via the gate of said FET; and at least one capacitive device connected between the drain of said FET and ground for blocking direct current and for passing alternating current.

6. A mixer according to claim 5, further comprising a second capacitive device which is connected to the source of said FET and which has a low impedance at the frequency of said mixed signal and a high impedance at the frequency of said data signal.

7. A mixer according to claim 5, further comprising:

an inductive device which is connected to the source of said FET and which has a high impedance at the frequency of said mixed signal and a low impedance at the frequency of said data signal.

8. A mixer according to claim 6, further comprising:

an inductive device which is connected to the source of said FET and which has a high impedance at the frequency of said mixed signal and a low impedance at the frequency of said data signal.

* * * * *